(12) United States Patent
Wimplinger et al.

(10) Patent No.: US 10,438,798 B2
(45) Date of Patent: Oct. 8, 2019

(54) APPARATUS AND METHOD FOR BONDING SUBSTRATES

(71) Applicant: EV GROUP E. THALLNER GMBH, St. Florian am Inn (AT)

(72) Inventors: Markus Wimplinger, Ried (AT); Viorel Dragoi, Sankt Florian/Inn (AT); Christoph Flotgen, St. Florian/Inn (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 15/862,678

(22) Filed: Jan. 5, 2018

(65) Prior Publication Data

US 2018/0130658 A1    May 10, 2018

Related U.S. Application Data

(63) Continuation of application No. 15/021,725, filed as application No. PCT/EP2013/069900 on Sep. 25, 2013, now Pat. No. 9,899,223.

(51) Int. Cl.
*H01L 21/18* (2006.01)
*H01L 21/263* (2006.01)
*H01L 21/67* (2006.01)

(52) U.S. Cl.
CPC .......... *H01L 21/187* (2013.01); *H01L 21/263* (2013.01); *H01L 21/67092* (2013.01)

(58) Field of Classification Search
None
See application file for complete search history.

(56) References Cited

U.S. PATENT DOCUMENTS

| 6,153,524 A * | 11/2000 | Henley ................... C23C 14/48 438/690 |
| 8,062,957 B2 | 11/2011 | Khalid |
| 9,130,000 B2 | 9/2015 | Tsuno et al. |
| 9,899,223 B2 * | 2/2018 | Wimplinger .......... H01L 21/187 |
| 2002/0072223 A1 * | 6/2002 | Gilbert .............. H01L 21/32051 438/629 |

(Continued)

FOREIGN PATENT DOCUMENTS

| CN | 101952934 A | 1/2011 |
| DE | 10 2011 116 233 A1 | 5/2012 |

(Continued)

OTHER PUBLICATIONS

International Search Report from corresponding International Patent Application No. PCT/EP2013/069900, dated Jun. 4, 2014.

*Primary Examiner* — Jay C Chang
(74) *Attorney, Agent, or Firm* — Kusner & Jaffe (57) ABSTRACT

A device and method is described for producing an electrically conductive direct bond between a bonding side of a first substrate and a bonding side of a second substrate. A workspace is included that can be closed, gas-tight, against the environment and can be supplied with a vacuum. The workspace includes a) at least one plasma chamber for modifying at least one of the bonding sides and at least one bonding chamber for bonding the bonding sides, and/or b) at least one combined bonding/plasma chamber for modifying at least one of the bonding sides and for bonding the bonding sides.

17 Claims, 3 Drawing Sheets

(56) References Cited

U.S. PATENT DOCUMENTS

| | | |
|---|---|---|
| 2003/0194850 A1* | 10/2003 | Lewis ................. H01L 21/2855 |
| | | 438/584 |
| 2004/0132304 A1 | 7/2004 | Farrens et al. |
| 2005/0139321 A1* | 6/2005 | Higashiura ......... C23C 16/5096 |
| | | 156/345.44 |
| 2006/0228900 A1 | 10/2006 | Dip et al. |
| 2009/0286382 A1 | 11/2009 | Huff |
| 2011/0053342 A1 | 3/2011 | Khalid |
| 2011/0129986 A1 | 6/2011 | Libralesso et al. |
| 2011/0207291 A1 | 8/2011 | Tsuno et al. |
| 2012/0111925 A1 | 5/2012 | Diep et al. |
| 2013/0063675 A1* | 3/2013 | Misaki .................. G02F 1/1368 |
| | | 349/46 |
| 2013/0153093 A1 | 6/2013 | Vandroux et al. |
| 2013/0160794 A1 | 6/2013 | Griffith Cruz et al. |
| 2013/0193108 A1 | 8/2013 | Zheng et al. |

FOREIGN PATENT DOCUMENTS

| | | |
|---|---|---|
| JP | H09-246557 A | 9/1997 |
| JP | 201087278 A | 4/2010 |
| JP | 2011512040 A | 4/2011 |
| JP | 2012104817 A | 5/2012 |
| TW | 201222108 A | 6/2012 |
| WO | WO-2012/100786 A1 | 8/2012 |
| WO | WO-2012/136266 A1 | 10/2012 |
| WO | WO-2012/136267 A1 | 10/2012 |
| WO | WO-2012/136268 A1 | 10/2012 |

\* cited by examiner

APPARATUS AND METHOD FOR BONDING SUBSTRATES

RELATED APPLICATIONS

This application is a continuation of U.S. application Ser. No. 15/021,725, granted as U.S. Pat. No. 9,899,223, filed Mar. 14, 2016, which is a U.S. National Stage Application of International Application No. PCT/EP2013/069900, filed Sep. 25, 2013, said patent applications herein fully incorporated herein by reference.

FIELD OF THE INVENTION

The present invention relates to a device for creating an electrically conductive direct bond between a bonding side of a first substrate and a bonding side of a second substrate, as well as a corresponding method.

BACKGROUND OF THE INVENTION

When bonding metallic or metallized substrates, substrates with metallic surfaces, semiconductor substrates, or compound semiconductor substrates, the oxidation of the bonding sides of the substrates to be bonded plays a significant role, as it impedes the bonding process. The oxide prevents or reduces the formation of a mechanically and/or electrically valuable contact. Notably associated with this is, due to longer heating and cooling times, a deterioration in throughput; and, the higher the temperature is or must be during bonding, the larger the influences of expansion owing to temperature differentials are on the alignment or adjustment accuracy of the substrates relative to one another. Furthermore, certain MEMS and/or semiconductor assemblies, for example, such as microchips or memory chips, do not allow high process temperatures.

In the state of the art, mainly wet etching processes are used for removing oxides that form on the above-mentioned substrates and consequently prevent, or at least impede, an optimum bonding of multiple substrates through a bond process. In the wet etching processes, hydrofluoric acid or hydrofluoric acid-containing mixtures are predominantly used. After reduction of the oxide, a surface—terminated by hydrogen atoms—emerges. These hydrophobic surfaces are suitable for producing a so-called pre-bond. If the two wafers are, however, to become permanently connected to each other, the wafer stack must be heat-treated at elevated temperatures, so that the hydrogen that is produced through the reduction process and terminates the surface of the substrate is removed from the bond interface, and a permanent connection between the two substrate surfaces, especially silicon surfaces, can form. The substrate stack is heat-treated after the surfaces make contact. Silicon wafers are, for example, heat-treated at a temperature of approximately 700° C. in order to ensure such a permanent connection. The methods of the art serve especially to produce multi-layer metal, semiconductor, glass, or ceramic bonds. An especially important application relates to production of photovoltaic multi-layer cells and photonic crystals, especially photonic crystals made of silicon.

One of the major limitations in producing multi-layer cells is the incompatibility of the lattice structures of the individual semiconductor materials with regard to their size and shape. In the production of individual layers through direct epitaxial growth of the layers, this leads to defects in the semiconductor layer brought about by this process. These defects compromise the quality of the produced layer and especially the efficiency that can be achieved in converting light into electric energy. This efficiency is also referred to as quantum efficiency and defines, for solar cells, the ratio of the charge carriers, usable by the photo process, to the quantity of absorbed photons of a particular wavelength. From this in practice, arise constraints with respect to the following parameters:

a) Number of feasible active layers in the structure. This is, due to the difficulty described above, limited to two, or a maximum three layers.

b) Optimization of the individual layers with regard to an optimum wavelength range. In practice, it is not possible today to optimize the individual layers completely freely with regard to the optimum wavelength range and associated conversion characteristics for the conversion from light into electric energy, as compromises must always be made in regard to compatibility of lattice structures.

c) Use of better materials: for certain wavelengths it would be desirable to use silicon or germanium, for example, as these materials would allow for an ideal compromise between efficiency and cost. The use of these materials, however, is often not possible, because the lattice structures are not sufficiently compatible with the other structures used in the cell.

An oxide treatment, specifically oxide removal, before a subsequent bonding process, is often carried out using hydrofluoric acid. In the process, contamination of the surface and especially regrowth of the oxide may occur after oxide removal.

A further problem in this regard is that a variable waiting period between oxide removal and further treatment of the substrate leads to a variable process result of the bonded substrate stack.

A further disadvantage of previous methods is that etching processes must be tailored to the oxide to be etched. As a result, different etching chemicals are required for different semiconductor materials in certain circumstances.

Furthermore, the process requirements with regard to wait time until treatment, kind of process environment conditions (for example, inert atmosphere, free from $O_2$ and, optionally, also free from water) are, in certain circumstances, also different depending upon material. For this reason, a bonding system for bonding different substrates, composed of different materials, can wind up being quite complex. Additionally, due to the different requirements imposed by various materials, a considerable process development effort can arise as soon as new materials are to be introduced into manufacture.

Physical processes, in addition to the already-mentioned chemical processes, represent another means for oxide removal. One of the most important physical processes for oxide removal is sputtering. Sputtering is defined as the removal of atoms on the surface of a substrate by collision processes of ionized atoms of sputter gas that are ionized and are accelerated by electric and/or magnetic fields.

Sputtering, however, is disadvantageous in that the process inherently generates particles; this is in the nature of the process of removing material from a surface by means of a physical process. This material can be deposited in all manner of places in the process chamber and can either be precipitated, through sublimation, from these places onto the substrate to be bonded or can be directly resublimed back onto the substrate. These particles are obstructive to an optimum—that is, void-free—bond result. In addition, sputtering processes require very high ion energies in order to be able to remove matter from the surface of the substrate. This leads to ions being partially implanted in the substrate, which damages the layer near the surface. This damaged layer can be several nm thick, typically even 5 to 10 nm or more. This damage can negatively affect the characteristics of the bond connection in regards to electric and optical parameters, with the result that this damage is undesirable and presents a problem in practice.

Another fundamental problem in manufacturing multi-layer cells is heat-treatment, which is typical for many processes. Heat-treating is done between 100° C. and 700° C. At such high temperatures, the materials used are mechanically heavily stressed. In the presence of high temperature differentials, mechanical strain is determined by, above all, thermal stresses. The thermal stresses are dependent on the thermal expansion coefficient and temperature differential. If materials cannot expand freely together because they are welded together along a bond interface, a difference in the thermal expansion coefficients in the presence of a temperature differential results in correspondingly high thermal stress. Because the choice of material is quite often determined by other boundary conditions, thermal stresses can only be avoided when the temperature differentials within the process steps are as small as possible.

It should be mentioned that the material combinations with which the bonding process should offer the greatest advantage (as an integration of materials with different lattice parameters and/or different thermal expansion coefficients should follow) are least compatible with a heat-treatment process because it is mostly here that the greatest differences with regard to thermal expansion occur.

The purpose of the present invention is therefore to specify a device and a method for bonding with which the bonding process can be carried out more efficiently and qualitatively more valuably.

SUMMARY OF THE INVENTION

This task is accomplished with the features of the independent claim(s). Advantageous enhancements of the invention are given in the subclaims. The scope of the invention includes all combinations of at least two features given in the description, the claims, and/or the figures. With the given value ranges, values that lie inside of the boundaries mentioned should also be revealed as limits and should be claimable in any combination.

The present invention describes a system and a method for plasma-treatment of an oxide layer of a substrate. The plasma-treatment can thereby, according to the invention, lead to a complete removal, a partial removal, and/or a change of the stoichiometry of the oxide layer and/or to an amorphization of the complete, or at least near-surface, layer.

The invention thereby enables in particular the in-situ treatment of the oxide layer in a plasma chamber, in which the plasma is comprised of at least one reducing gas, especially hydrogen.

With the device according to the invention and the method according to the invention, it is possible to carry out the treatment of the oxide as well as the subsequent bonding process completely in a workspace sealed against the atmosphere (or in modules connected to the workspace) so that renewed oxidation of the surface after the oxide is treated is prevented.

The invention describes a system and a method that make it possible to:

(1) manufacture, by means of reduction gas, multiple substrates with a specifically altered oxide layer in a plasma chamber,
(2) transport the substrates in a vacuum environment, especially in a high-vacuum environment, to a bonding module, and
(3) bond the substrates to one another in the bonding module.

Modification is defined as follows according to the invention:

Alteration of the stoichiometry of the oxide during and/or after precipitation, and/or Removal of a certain amount of an already existing oxide layer, up to a desired, new oxide layer thickness, or Complete removal of the oxide layer, and/or Amorphization of the oxide layer.

This is accomplished by means of a device that makes it possible to expose the substrates to a plasma that contains a reducing gas. In particular, $H_2$ finds use in a mixture with at least one second gas, especially an inert gas. The use of $H_2$/Ar mixtures has proven to be the preferred variant.

The gas mixture $H_2$/Ar is optimum due to the mass ratio between argon and oxygen. The argon atoms, which are somewhat heavier than oxygen, are ionized by the plasma, accelerated onto the oxide to be reduced, and break it up physically, especially mechanically, with kinetic energy. The oxygen which is released by this process is captured accordingly by hydrogen molecules, hydrogen ions, or hydrogen radicals. The water produced by this, which is thermodynamically relatively stable, is then drawn off from the surface in order to prevent a reverse reaction to metal oxide. Helium is not suitable due to its rather small mass. Neon atoms are admittedly more massive than oxygen atoms, but only marginally so. Krypton and all other noble gases are too expensive and too rare and are therefore not worthwhile economically for breaking oxides.

Other reducing gases according to the invention would be notably:

Nitric oxides and/or

Carbon monoxide and/or

Methane and/or

Hydrogen and/or

Acetic acid vapor and/or

Citric acid vapor.

The following find use as inert gases, notably:

Xenon and/or

Argon and/or

Helium and/or

Nitrogen and/or

Carbon dioxide.

The substrates are exposed to the plasma in the process chamber, particularly in a vacuum. As a result, a modification of the oxide layer occurs. The modification takes place either through a change in the stoichiometry of the oxide and/or through ablation of the oxide layer thickness to a specific and desired value or through a complete removal of the oxide through amorphization.

The ion energies of the plasma are less than 1000 eV, preferably less than 500 eV, more preferably less than 250 eV, even more preferably less than 150 eV, and most preferably between 30 eV and 150 eV.

Afterwards, the substrates are aligned to each other and brought into contact with each other either in the same module or, preferably, in a separate bonding module specially configured for this purpose. In so doing, the substrates are bonded. Optionally, this can be further promoted by applying a force in order to ensure that the substrates come reliably into contact over the entire surface. The transfer between the plasma module and the bonding module takes place in a high vacuum environment by means of a moving device. In this process the substrates are preferably transported by means of a robot.

According to the invention, either the surface of just one substrate or the surfaces of both substrates can be treated before the bonding process of the two substrates takes place.

Advantages of the Invention

Fast,
Universally usable for many different substrate materials and oxide types,
Reproducible process results,
High-quality results due to the process taking place in a high vacuum, which prevents contamination of the surface,
Environmentally friendly,
Economical,
No waste products that must be disposed of, and
Ideally no, or at least an only minor or at least precisely adjustable, damaging of the substrate surface due to implantation.

The concept according to the invention includes the treatment, especially precise adjustment of the stoichiometry, of oxides by means of reducing gases and/or gas mixtures in plasma enclosures, and/or the amorphization of the oxide, at least in a region near the surface. Therefore, according to the invention, atomic and/or molecular gases are used.

Fundamentally, the invention is based on treating substrates in a reducing atmosphere of a plasma. For this purpose all atmospheres are conceivable that are comprised of at least one gas that is suitable for effecting an oxide reduction of an oxide present on the bonding side.

Due to its availability and attractive cost, the use of $H_2$ is preferable according to the invention. It is known in the literature that oxides on semiconductor substrates can be reduced by using $H_2$. As a rule, however, a very high temperature (>600° C.) is required for this. This is unacceptable for a large number of substrates, especially complex compound semiconductor substrates, because this would, in the worst case, lead to a decomposition of the material (GaAs, for example, decomposes at 400° C.)—or at least a change in the layer structure owing to diffusion processes. A major aspect of the invention, therefore, is to configure the process such that oxide reduction can take place at low temperatures, preferably below 200° C., more preferably below 150° C., even more preferably below 100° C., and most preferably at room temperature.

In order to make this possible, a plasma is ignited from the chosen atmosphere. Due to the ion energies of the ions generated in the plasma and impinging on the substrate, enough energy is supplied or provided so that the reaction can take place at very low temperatures, preferably room temperature, and/or so that amorphization of the oxide takes place. In this way, materials can be treated very gently as regards thermal stress.

By means of parameter adjustments, a variety of different substrates can be treated using the same basic idea without having to change the base chemistry. Preferably, the gas mixture of two or more gasses is adjustable depending upon the formula by means of a gas mixing system, which is part of the gas supply system for the process chamber; in this way, it can be adapted to different substrates.

In principle, any kind of plasma chamber is conceivable for the implementation of the process. This includes CCP ("capacitively coupled plasma") chambers, ICP ("inductively coupled plasma") chambers, and remote plasma chambers.

According to the invention, CCP chambers are nevertheless preferred due to their simple structure and high productivity. The distance between the electrodes amounts to greater than 2 mm, preferably greater than 6 mm, even more preferably greater than 9 mm, even more preferably greater than 12 mm, and most preferably greater than 16 mm. According to the invention, it is especially envisioned that the bottom electrode be simultaneously implemented as a substrate holder. This substrate holder can simultaneously be implemented as a vacuum sample holder or alternatively and preferably as an electrostatic sample holder. It is furthermore conceivable that heating and/or cooling elements that permit a (moderate) temperature change of the substrate be incorporated.

The frequency of the applied AC voltage on the upper electrode is preferably greater than the frequency of the applied AC voltage on the lower electrode. Preferably, between the frequencies there is a difference of at least a factor of 10, more preferably at least a factor of 100, and even more preferably at least a factor of 250. A reciprocal influence of the frequencies on each other is thereby reduced. In particular, the upper frequency could amount to 13.56 MHz or 27 MHz, while the frequency to which the lower electrode is exposed could, in particular, amount to 40 kHz, 100 kHz, or 400 kHz. In this arrangement, the upper frequency predominantly leads to an ionization of the atmosphere, while the lower frequency leads to acceleration of the ions onto the substrate surface. Consequently, the density of the plasma and the ion energy with which the ions strike the substrate are individually adjustable. This is advantageous because the process is more manageable since the ion density and ion energy according to the invention are adjustable separately and independently from one another.

In a preferred configuration for oxide reduction of Si wafers, the frequency of the AC voltage of the upper electrode amounts to 13.56 MHz, and the frequency of the AC voltage of the lower electrode amounts to between 80 kHz and 120 kHz. The power of the upper and lower electrode lies between 50 W and 500 W. Preferably, a blend of $H_2$/Ar, whose concentration values lie between 100% $H_2$/0% Ar and 0% $H_2$/100% Ar and have no other noteworthy components greater than 1%, is used as a gas mixture. The concentration is preferably under 80% $H_2$, more preferably under 60% $H_2$, even more preferably under 40% $H_2$, and most preferably under 20% $H_2$.

The supply of gas takes place evenly over the circumference of the plasma chamber in order to ensure an even process result. The exhaustion of the gas out of the plasma chamber takes place likewise evenly, particularly through outlets distributed over the circumference of the chamber. During the plasma treatment process, the chamber is continually perfused with the gas mixture in order to remove the reaction products, particularly $H_2O$, generated by the reaction, from the chamber. This is crucial since it is especially envisioned for better oxide reduction that a larger number of reduction reactions will take place than renewed oxidization of Si with $H_2O$. In order to ensure the uniformity of the reaction, it is especially envisioned to ensure an even gas flow in the chamber during the process as well as consequently an even concentration of the process gas.

The ion energy with which the particles strike the surface of the substrate is controlled primarily via the lower electrode. This energy, on the one hand, influences the successful treatment of the oxide on the substrate surface and, on the other hand, is set so low that only minimal implanting of the substrate surface and associated damaging occurs.

On the other hand, however, there may be a desire to produce a controlled damaging of the substrate surface in order to create a layer that has a lower mechanical strength. This, by means of pressing based on a high pressing force, advantageously enables the closing of nano-gaps between the surfaces after the substrates make contact. The pressure on the surface lies between 0.01 MPa and 10 MPa, preferably between 0.1 MPa and 8 MPa, more preferably between 1 MPa and 5 MPa, and most preferably between 1.5 MPa and 3 MPa. These values roughly correspond to a force impact of from 1 kN to 320 kN for a common 200 mm substrate. Preferably and according to the invention, an amorphization of the oxide or at least the near-surface oxide area comes about through this controlled damaging. The amorphization of the surface takes place preferably through the adjustment of the ion energy. The amorphous area can encompass the entire oxide layer, but is preferably limited to one near-surface region. The thickness of the amorphous layer thereby is, in particular, smaller than 10 nm, preferably smaller than 5 nm, more preferably smaller than 1 nm, and most preferably smaller than 0.1 nm.

Preferably, it is conceivable first to start the process with a gas mixture optimized for oxide reduction and, after oxide reduction has occurred, to vary the gas mixture and to shift to a mixture that is optimized for targeted surface damaging. This can take place dynamically during the process and can be effected by a control device, especially a software-supported one.

Changing the gas mixture can also be accompanied by an adaptation of the adjustment of the frequency generators for the upper and/or lower electrode. In this way, the power of the lower and/or upper frequency generators can be preferably adjusted, voltage and current values for the generators altered, and frequencies changed. This can, in turn, be dynamically effected by the control device. Through these parameters, the thickness of the damaged layer, the density of the damage, and, optionally, the species or dose of the implanted ions can be adjusted.

The damage is usually associated with an amorphization of the near-surface areas.

As a rule, in the case of semiconductor substrates from which oxide is removed, the semiconductor wafer that lies underneath and is monocrystalline or at least crystalline (with few defects for example growth defects, due to MO CVD) is exposed by the reduction.

A typical process sequence would therefore include loading a substrate into a plasma chamber for a modification of at least one of the bond layers, an oxide reduction, an oxide reduction process, and optionally a process for targeted modification/damaging of the uppermost layer of the substrate.

Furthermore, inside the workspace the substrates are transported in a high-vacuum environment to a bonding chamber and are there mechanically and/or optically aligned and brought into contact. Optionally, they are also exposed to a (heavy) force and pressed together. The pressure on the substrates can subsequently be removed. The bonding chamber can, according to the invention, be the same as the plasma chamber—that is, a bonding plasma chamber.

The high-vacuum environment has, according to the invention, a pressure of less than $1\times10^{-5}$ mbar, preferably less than $5\times10^{-6}$ mbar, more preferably less than $1\times10^{-6}$ mbar, even more preferably less than $5\times10^{-7}$ mbar, and most preferably less than $9\times10^{-8}$ mbar.

In another configuration, the reduction processes according to the invention are not used for complete removal of the oxides, but rather are used for setting a correct stoichiometry of the oxides. In particular, layers can thereby be produced that have a surplus of an element/elements that bind to oxygen. For example, silicon oxide is no longer found in the stoichiometrically correct form as $SiO_2$, but as nonstoichiometric $SiO_{2-x}$. In general, nonstoichiometric compositions $SiO_{2-x}$ with x between 0 and 2 are produced, for example. Similar considerations hold for other oxides. Non-stoichiometry is to be understood in crystal-physics terms to be due to oxygen atoms being absent from their positions in the crystal lattice. Due to this absence of oxygen atoms, the density of defects increases. The defects are in turn of utmost importance for all types of transport processes.

In another configuration, the reduction processes according to the invention are not used for complete removal of oxides, but rather for producing an oxide layer with a defined layer thickness. Already present oxide layers are thereby ablated by reduction processes according to the invention to reach a desired thickness. The layers so produced can, for example, then be used for the processes disclosed in the patents PCT/EP2011/000299, PCT/EP2011/055470, PCT/EP2011/055469, and PCT/EP2011/055471. According to the invention, the oxides are, before the removal process, larger than 1 nm, preferably larger than 100 nm, more preferably larger than 10 µm, even more preferably larger than 100 µm, and most preferably larger than 1000 µm. After the removal process, the oxides are preferably smaller than 100 µm, preferably smaller than 10 µm, more preferably smaller than 100 nm, even more preferably smaller than 10 nm, and most preferably smaller than 1 nm.

The targeted modification of an oxide layer aids in producing an optimum hybrid bond. A hybrid bond is a connection between two surfaces that, in turn, are composed of conductive and nonconductive regions. The conductive regions are predominantly metallic areas, especially made of copper, whereas the nonconductive areas are comprised primarily of a dielectric such as silicon oxide. The dielectric and electric areas are particularly ground down to the same level, so that the electric areas are completely surrounded by a dielectric and are therefore isolated from the environment. Through alignment and the contacting and bonding of two such hybrid surfaces, a hybrid bond is formed, i.e., a connection between two substrates on which, preferably, the conductive and nonconductive regions are bonded to one another.

Substrates according to the invention are, particularly, Si-substrates, in which Cu—Cu bonds are present on the bonding sides, which are bonded in the further course of the process. Alternatively, substrates according to the invention with other metal layers such as Au, W, Ni, Pd, Pt, Sn, etc., or a combination of metals can be used. Examples of this would be Si-wafers that are coated with Al, Si-wafers that are coated with Cu and Sn, Si-wafers that are coated with Ti, or Si substrates that are covered with Cu and an industry-standard barrier layer (underneath the Cu and familiar to one skilled in the art) of, for example, Ti, Ta, W, TiN, TaN, TiW, etc. that is intended to prevent Cu from diffusing into Si. Such diffusion barriers are familiar to one skilled in the art.

According to the invention, it is thus crucial to provide a workspace that is sealed, preferably hermetically sealed, against the environment (meaning an oxidizing atmosphere) and lockable, and to provide appropriate attached modules in which both a reduction of potential oxide layers on the bonding sides, preferably on the entire substrate, and bonding can take place. A renewed oxidation of the bonding sides between reduction and the bonding process can thereby be prevented. Depending on the state of the substrates, especially of the metal coating on the substrates, different components of an atmosphere can be oxidizing. In most cases, however, oxygen and chemical compounds that contain oxygen have an oxidizing effect. In the workspace, therefore, the concentration of oxygen and water/water vapor should be greatly reduced (or preferably be approximately zero) when using a reducing media composition. The workspace connects multiple modules, so that transporting of substrates between the modules of the module group is possible without re-exposing the substrate to the atmosphere. Configurations are conceivable in which only one module is connected to the workspace; this module can, however, perform all necessary tasks according to the invention. The workspace is used in this case exclusively for loading and unloading.

According to the invention, it is particularly conceivable to connect additional modules to the work space for further process optimization, especially for pre- and/or post-treatment and/or measurement of the physical and/or chemical characteristics of the substrates to be bonded in the workspace. Major procedure steps here can be heating, reducing, aligning, cooling, thickness measuring, bond strength measuring, etc.

According to the invention, this can be done particularly advantageously in terms of hardware when additional modules according to the invention (such as especially the reduction module and the bonding module) are arranged around the workspace, particularly around the movement mechanism; whereby the modules are especially dockable on the workspace. The movement mechanism is preferably a trade-standard industrial robot with corresponding end-effector. The modules can thereby be arranged or docked particularly in a star or clustershape about the central module.

In the most ideal case, the reduction module and the bonding module are so constructed that the throughput of the entire system is maximized with regard to these process steps.

In a particularly advantageous configuration, at least two modules, of which at least one is a reduction module and the second is a type of storage module, would be positioned before the bonding module. The bond chucks are loaded with the loaded wafers into the reduction module and treated. Afterwards the bond chucks can be initially stored in the storage module, so that they are available at any time for immediate use in bonding. In a special configuration, the storage module can also be constructed as a reduction module. The reduction module is preferably constructed such that multiple bond chucks and/or multiple substrates can be simultaneously accepted.

A particularly independent aspect of the present invention is how these layers can be stacked in an electrically conductive and optically transparent form through a process that is simultaneously economical. In addition to this, the preparation of the substrates necessary for this is described.

The method described thereby is preferably suitable for stacking multi-layer solar cells. Alternatively, the method can also be implemented for producing all other structures and components in which optically transparent and electrically conductive connections between arbitrary (especially optical) materials, especially semiconductor materials, glasses, and ceramics, are necessary. In this segment an increasing number of uses is arising due to the greatly increasing importance of solid light sources such as LEDs and lasers in a variety of applications such as lighting, communication, and material treatment. Likewise in the segment of display manufacturing, new and innovative manufacturing technologies are becoming more important as additional functions such as touch detection (feedback in the field of touch screens, etc.) are integrated into displays.

Advantages of the invention are, above all:
Electrically conductive, optically transparent bonding interfaces or compound layer,
Very thin, robust, and long-term stable bonding interfaces or layer(s),
Temperature-resistant bonding interfaces or layer(s) and
High efficiency (fast and economical in production)

A central, especially independent aspect of the present invention is the use of transparent, conductive oxides to manufacture the electrically conductive and optically transparent compound layer between the substrates. The compound is produced in particular by means of wafer bonding, preferably with a direct bonding process and more preferably with a direct bonding process with plasma activation.

Indium-tin-oxide ("ITO" for short) is used in particular for transparent, electrically conductive oxides ("Transparent Conductive Oxides", or "TCO"). ITO will be used as an abbreviation for Indium-Tin-Oxide from this point on. ITO is widely used in the manufacture of LCD displays, where it is used as an optically transparent electrical conductor. Alternatively, the following materials are used:
Doped zinc oxides, especially aluminum-doped zinc oxide ("AZO"), gallium-doped zinc oxide ("GZO")
Fluoride-doped tin oxide ("Fluorine Tin Oxide" or "FTO"), as well as
Antimony-Tin-Oxide ("ATO")

Basically, any material that is oxidizable and has, with corresponding doping, the desired characteristics, especially electrical conductivity and optical transparency, can be used.

According to the invention, electrical conductivity is the term used in this regard when the material has a conductivity of >10e1 S/cm, preferably of 10e2 S/cm, and more preferably of >10e3 S/cm (measured with the four-point method, standard in semiconductor technology and related to a temperature of 300K). The optical transmission (transmittance factor)—defined as that percentage of light, of a certain wavelength range, that should pass through the layer during typical use—should, through a film with typical thickness, amount to at least >80%, preferably >87%, more preferably >93%, and even more preferably >96%.

According to the invention, wavelength ranges that extend from 300 nm to 1800 nm are preferred for photovoltaic uses. That means that the relevant wavelength range is, at any rate, larger than the wavelength range visible to humans. This should ensure that the UV portion of the light and the IR portion of the light can be converted into electric energy. Because the uppermost layer of a multi-layer solar cell already processes one part of the spectrum and consequently converts it into electric energy, it is acceptable if the bond connection has a somewhat smaller wavelength range in which it admits transmission. In particular, the transmission values given above should therefore apply to at least wavelengths >600 nm, preferably >500 nm, more preferably >400 nm, and most preferably >350 nm. Furthermore, the transmission values should also apply to the entire wavelength range starting from the minimum wavelength to a maximum of 1300 nm, preferably to a maximum of 1500 nm, more preferably to a maximum of 1700 nm, and most preferably to a maximum of 1800 nm.

The oxides are, according to the invention, applied to the substrate to be bonded particularly by means of the following methods:

MO CVD, Metal Organic Molecular Beam Disposition, Spray pyrolysis, Pulsed Laser Deposition (PLD) or, Sputtering.

In order to ensure the desired characteristics of the layers, it is critical according to the invention to ensure the correct mixture ratio. In particular, the amount of oxygen can improve optical transparency with some of these oxides, whereby it must be ensured that the amount of oxygen does not turn out too high; otherwise, electrical conductivity will be reduced.

In general, the bond connection (compound layer, also bonding interface) is produced by a precursor layer structure being deposited on the substrate to be bonded. Subsequently, the layers are plasma-activated and, especially at room temperature, joined, whereby a pre-bond (temporary bond) arises. During the heat-treating process (annealing) following this, the precursor layer structure is converted into a layer composed of transparent, electrically conductive oxide, whereby the bond connection is simultaneously strengthened. An amorphous layer, existing at least in the surface region, can affect the bonding process, which is especially advantageous. By applying an appropriate force, deformation of the near-surface regions can ensue, which guarantees optimum sealing of micro- and/or nano-pores.

When forming gas is used, it is notably possible to alter, and especially to completely remove, the oxide layer through a process that is based on sputtering and oxide reduction.

Alternatively, or in addition to this measure, it is advantageous according to the invention to minimize the time between altering the oxide layer and making contact, especially to <2 hours, preferably <30 minutes, more preferably <15 minutes, and ideally <5 minutes. An undesired and altering oxide growth that follows the targeted adjustment of the oxide layer can thereby be minimized.

By setting a certain pressure in the vacuum chamber, it is conceivable to influence or adjust the mean free path length for the plasma ions according to the invention.

In the case of capacitive coupling, it is advantageous for the electrodes to be arranged inside of the plasma chamber.

An optimum striking of the contact surfaces is reached through adjustment of the parameters of (different) frequencies of the electrodes, of amplitudes, of a bias voltage applied particularly and preferably exclusively to the second electrode, and of chamber pressure.

Designing the plasma activation system as a capacitively coupled double frequency plasma system advantageously makes it possible to adjust the ion density and the acceleration of the ions onto the wafer surface separately. Consequently, attainable process results are adjustable within a broad window and adaptable to meet the requirements of use.

The bias voltage, especially in the form of a base voltage of the second, particularly lower electrode, serves to influence, and especially to lessen or accelerate, the impact (speed) of the electrodes onto the contact surface of the substrate accommodated on the second electrode.

Through the aforementioned parameters, the quality in particular of the amorphous layer is adjustable, whereby particularly advantageous configurations will be described hereinafter.

With an inductively coupled plasma source, corresponding analogy considerations about the AC voltage of the capacitive coupling can be applied to alternating currents that are used to produce a magnetic field. According to the invention, it is conceivable to manipulate the plasma of the inductively coupled plasma source by means of an alternating current or magnetic AC field of varying strength and/or frequency so that the plasma has corresponding characteristics according to the invention.

With a remote plasma, the actual plasma to be used is produced in an external source and introduced into the sample chamber. In particular, components of this plasma, especially ions, are transported into the sample chamber. The transition of the plasma from the source chamber into the substrate chamber may be ensured by means of various elements such as sluices, accelerators, magnetic and/or electric lenses, blending, etc. All considerations applying to the capacitively and/or inductively coupled plasma with regard to frequencies and/or strengths of the electric and/or magnetic fields should apply to all elements that ensure the generation of the plasma and/or the transition of the plasma from the source chamber into the substrate chamber. For example, it would be conceivable that a plasma, through capacitive or inductive coupling and parameters according to the invention, be produced in the source chamber and subsequently enter the substrate chamber via the above-mentioned elements.

According to a further advantageous configuration of the invention, it is envisioned that the construction of the irreversible bond would take place at a temperature typically lower than 300° C., advantageously at lower than 200° C., more advantageously at lower than 150° C., even more advantageously at lower than 100° C., and most advantageously at room temperature, especially in a maximum of 12 days, preferably 1 day, more preferably 1 hour, and most preferably 15 minutes. A further advantageous heat-treatment method is heating by microwaves.

It is particularly advantageous thereby when the irreversible bond has a bond strength of greater than 1.5 J/m$^2$, especially greater than 2 J/m$^2$, preferably greater than 2.5 J/m$^2$.

The use of solar energy by means of photovoltaic systems is gaining in importance, as fossil fuels are becoming scarce in the medium term; furthermore, their extraction and use pose a considerable ecological problem—particularly by contributing to the greenhouse effect. In order to increase the competitiveness of photovoltaics—from a purely economic standpoint—it is necessary to improve the efficiency of the conversion of light into electric energy at the same cost, or at most at a moderate price increase. In so doing, there are nevertheless limits to the possible efficiency. These limits exist primarily because a single semiconductor material can only process light and convert it into electric energy in a restricted wavelength range.

Use of the present invention in the production of multi-layer solar cells or known under "Multi-Junction Solar Cells" is therefore particularly advantageous.

In these, the individual layers lie vertically stacked on top of each other in the solar cell. Incident light first hits the uppermost layer, which is optimized to convert light with a particular first wavelength range into electric energy. Light with a wavelength range that largely cannot be processed in this layer penetrates the first layer and encounters the underlying second layer which is optimized to process a second wavelength range and thereby produce electrical energy. Optionally, it is possible in these multi-layer cells for light with a wavelength range that largely cannot be processed in this second layer to encounter an underlying third layer that is optimized to process light with a third wavelength range and convert it into electric energy. It is possible to imagine that, purely theoretically, a multitude of such layers would be possible. In practice, such cells are constructed in a way such that the uppermost layer, into which the incident light first penetrates, processes the wavelength range with the shortest wavelength. The second layer processes the next-shortest wavelength range, and so forth. Thereby, according to the invention, not only a two-layer structure is conceivable; rather, three or more layers are possible. It is thereby planned to connect the layers to each other optically transparently and electrically conductively, meaning with as little electric resistance as possible. The deposition of the layers takes place thereby particularly through so-called "Metalorganic Chemical Vapor Deposition" processes, "MO CVD" for short, whereby deposition of the two the active layers of the multi-cell takes place particularly "in-situ" (meaning without exposing the substrates to the normal environmental atmosphere between the deposition processes). Preferentially, barrier layers (second or fourth oxide layer) and/or buffer layers (second or fourth oxide layer) that improve the quality of the resulting cell are inserted between the active layers.

Where available and/or disclosed in the following figure descriptions, device features should be regarded as disclosed method features, and vice-versa.

BRIEF DESCRIPTION OF THE DRAWINGS

Further advantages, features, and details of the invention emerge from the following description of preferred configuration examples as well as from reference to the drawings. Shown in.

Shown (according to configurations of the invention) in the figures are advantages and features of the invention with references correspondingly identifying these, whereby components or features with equal or equivalent functions are denoted with identical references.

DETAILED DESCRIPTION OF THE INVENTION

Figure 2:
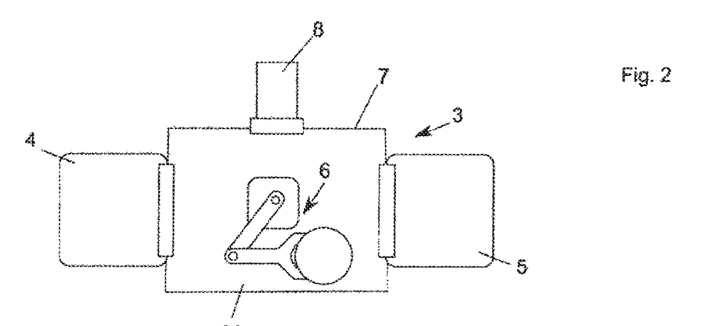
FIG. 2, which illustrates a schematic representation of a first configuration of a device according to the invention, comprising a bonding chamber and a plasma chamber separated spatially from it, both attached to the workspace.

In a first configuration shown in FIG. 2, a plasma chamber 4 and a bonding chamber 5 are two independent modules of a module group 3 that are attached, especially sealed, to an evacuatable workspace 22 defined by a work chamber 7. The work chamber 7 can be evacuated to a high vacuum, particularly controlled by a software-supported control device. Inside of the work chamber 7 a robot 6, specifically provided for the task, transports the substrates 1 among a storage container 8, the plasma chamber 4, and the bonding chamber 5.

Figure 3:
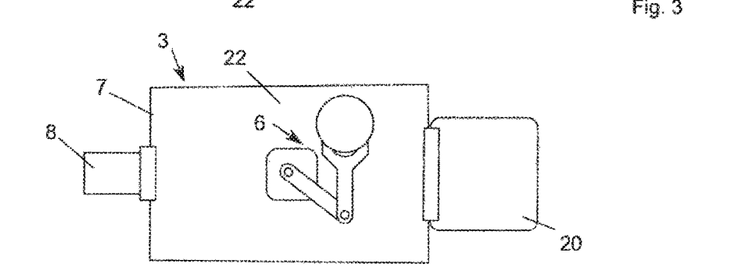
FIG. 3, which illustrates a schematic representation of a second configuration of a device according to the invention, comprising a bonding plasma chamber arranged on the workspace.

In a second configuration according to the invention, the plasma chamber 4 and the bonding chamber 5 are consolidated into a single module, namely a bonding/plasma chamber 20. The robot 6 transports the substrates 1 from the storage container 8 into the bonding/plasma chamber 20.

Figure 4:
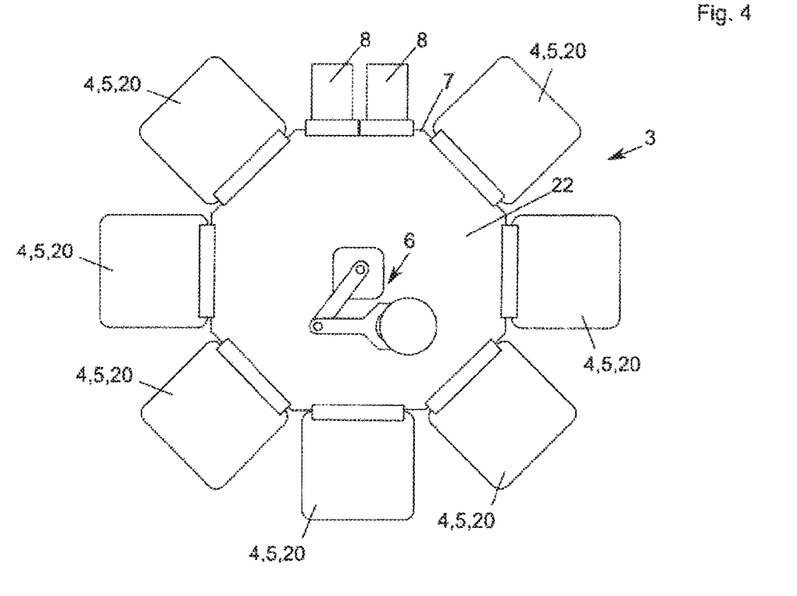
FIG. 4, which illustrates a schematic representation of a third configuration of a device according to the invention, comprising multiple plasma chambers and one bonding chamber.

In a third configuration according to the invention, one or more plasma modules 4 or bonding modules 5 or bonding/plasma modules 20 of the module group 3 are attached to the work chamber 7; these form, especially together, the workspace 22. The robot 6 transports the substrates 1 from the storage container 8 to the plasma modules 4 and/or bonding modules 5 and/or bonding/plasma module 20, especially to and fro among these as well. According to the invention, higher throughputs are achieved since several plasma modules 4 and/or several bonding modules 5 and/or several bonding/plasma modules 20 are used. The process is controlled by the control device.

Figure 1A:
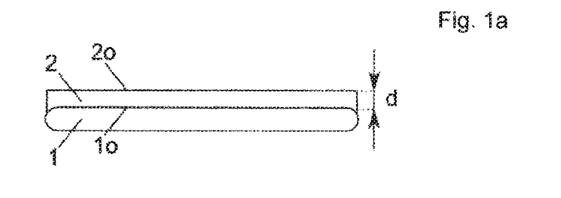
FIG. 1a, which illustrates a cross-sectional view of a substrate with an oxide layer.

In a first process according to the invention, a substrate 1 with an oxide layer 2 (FIG. 1a) formed on one bonding side 1o is removed by the robot 6 from the storage container 8.

The substrate 1 can be mounted on a mobile sample-holder and thus be transported back and forth among the plasma modules 4 and/or the bonding modules 5 and/or the bonding/plasma modules 20. It is certainly possible to transport the substrates 1 even without the mobile sample-holder. In this case the substrates 1 are laid on sample holders 15 that are already in, especially built into, the plasma modules 4 and/or the bonding modules 5 and/or the bonding/plasma modules 20.

Figure 5:
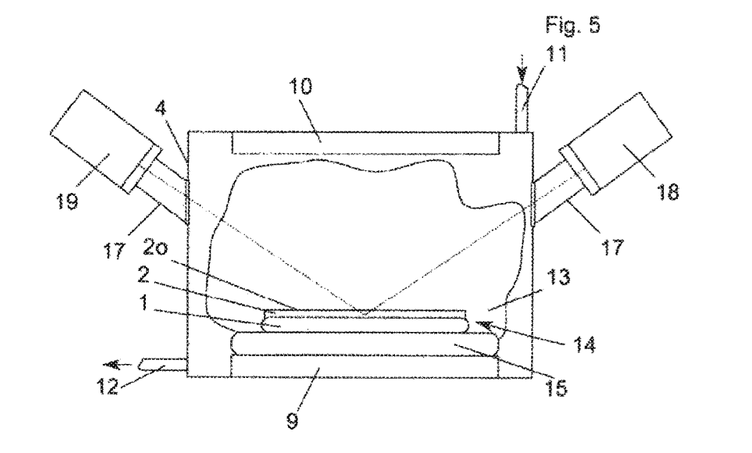
FIG. 5, which illustrates a schematic representation of a plasma chamber according to the invention.

The robot 6 initially transports the substrate 1 into a plasma module 4. The plasma module 4 has a gas supply 11, particularly equipped with multiple openings distributed on the upper perimeter, and an outlet 12, particularly equipped with multiple openings distributed on the lower perimeter. The gas mixture with the reducing gas according to the invention is introduced through the gas supply 11 into the plasma chamber 4.

The ignition and/or holding of the plasma subsequently takes place between a lower electrode 9 and an upper electrode 10. The substrate 1 preferably lies directly on the electrode. If the substrate 1 is to lie on the sample holder 15, the sample holder 15 must according to the invention be designed as an electrode 9.

Reduction products are preferably removed, particularly continually, from the plasma chamber 4 through an outlet 12. One of the processing steps according to the invention of the oxide layer 2 thus takes place in the plasma module 4.

Figure 1B:
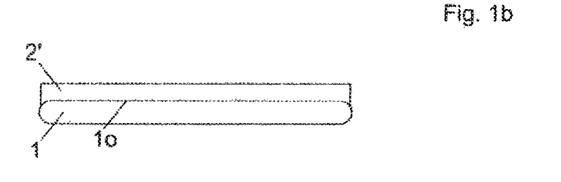
FIG. 1b, which illustrates the substrate from FIG. 1a with an oxide layer modified by plasma according to a first configuration of the invention.

In a first variant according to the invention, the oxide layer 2 is converted by the plasma 13 into an oxide layer 2' that is characterized by a different stoichiometry than oxide layer 2 (FIG. 1b). The different stoichiometry may in this case have already been produced by means of oxygen deficiency as early as the deposition of the oxide. Otherwise the stoichiometry can be adjusted and/or at least changed by the plasma through a targeted choice of process parameters.

Figure 1C:
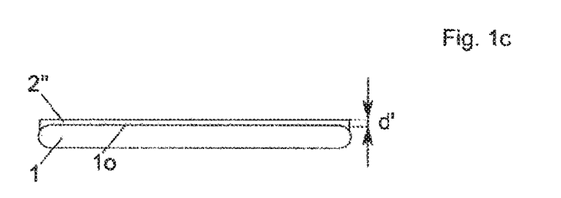
FIG. 1c, which illustrates the substrate from FIG. 1a with an oxide layer reduced in thickness by plasma according to a second configuration of the invention.

In a second variant, the oxide layer 2 with an initial layer thickness d is thinned by reducing gas in the plasma 13 to an oxide layer 2" with an end layer thickness d' (FIG. 1c).

Figure 1D:
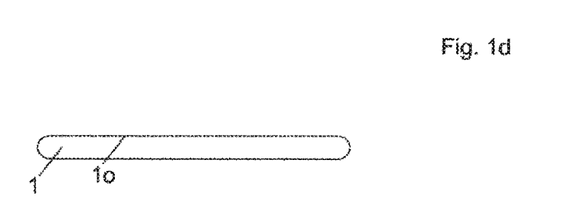
FIG. 1d, which illustrates the substrate from FIG. 1a with an oxide layer completely removed by plasma according to a third configuration of the invention.

In a third variant, the complete removal of the oxide layer 2 takes place (FIG. 1d).

Monitoring of the condition of the oxide 2, 2', 2" takes place preferably through a source-detector system with a source 18 and a detector 19, with which the surface 2o of the oxide layer 2, 2', 2" can be examined, preferably in-situ. The source 18 and/or the detector 19 can be inside and/or outside of the plasma chamber 4. If they are outside, they are preferably connected, vacuum tight, by flanges 17 to the plasma chamber 4. The source-detector system can use any known physical measurement principle that is suitable for providing information on the condition of the oxide layer 2, 2', 2". Among these are the thickness, porosity, and thus density as well as the reflectivity of the oxide layer 2, 2', 2".

Preferably, ellipsometers or diffractometers are used—in special cases, reflectometers.

The first substrate 1, processed thusly, is stored particularly in the storage container (not shown) arranged in the workspace 22.

Figure 6:
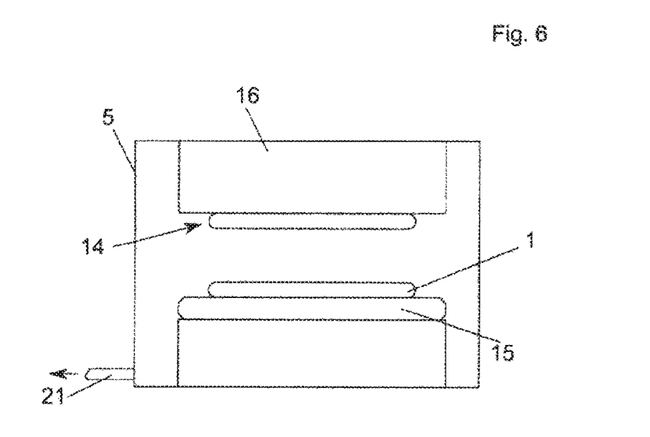
FIG. 6 a schematic representation of a bonding chamber according to the invention.

A second substrate 14 according to the invention that is likewise particularly processed on its bonding side according to the process according to the invention is transported into a bonding chamber 5 with or to the prepared first substrate 1. In the bonding chamber 5, the bonding process between the bonding side of the first substrate 1 and the bonding side of the second substrate 14 takes place. Bonders are known to one skilled in the art. One skilled in the art knows how such systems are constructed, how sample holders 15 and/or pressure plates 16 are built, how the convergence of the two substrates takes place, how the force for bonding the two substrates 1, 14 is applied, and how the bonding chamber 5 is evacuated through an outlet 21. The sample holder 15 can be configured as an electrostatic sample holder and/or heating sample holder and/or cooling sample holder. Preferably, the sample holder 15 is used for transport out of the plasma chamber 4. The sample holder 15 is preferably an electrostatic sample holder, in order to ensure good thermal expansion of the substrate 1 onto the sample holder 15. Mechanical clamping or clamping by vacuum would not allow free thermal expansion of the substrate 1 to the same extent as an electrostatic sample holder 15. In a very preferred configuration, the sample holder 15 is flushed with He from the front and/or back side, especially via a washing device built into the sample holder 15, in order to ensure or even improve thermal coupling.

After the successful bonding process, the robot 6 takes the bond stack produced by bonding from the two substrates 1, 14 and stores it, preferably in the storage container 8.

REFERENCE LIST

1 Substrate
1o Substrate surface
2, 2', 2" Oxide layer
2o Oxide layer surface
3 Module group
4 Plasma chamber
5 Bonding chamber
6 Robot
7 Work chamber
8 Storage container
9 Lower electrode
10 Upper electrode
11 Gas supply
12 Outlet
13 Plasma gas
14 Second substrate
15 Sample holder
16 Pressure plate
17 Flange
18 Source
19 Detector
20 Bonding/plasma chamber
21 Outlet
22 Workspace
d, d' Oxide layer thickness Having described the invention, the following is claimed:

1. A method for producing a direct bond between a bonding side of a first substrate and a bonding side of a second substrate in a workspace, the method comprising:
   modifying at least one of the bonding sides of the first and second substrates in one of a plasma chamber and a bonding/plasma chamber, the modifying comprising:
      changing a stoichiometry of an oxide layer on the at least one of the bonding sides of the first and second substrates;
      introducing, into the one of the plasma chamber and the bonding/plasma chamber, one or more reducing gases selected from the group consisting of hydrogen, nitrogen oxide, carbon monoxide, and methane; and
      mixing the one or more reducing gases with one or more inert gases selected from the group consisting of xenon, argon, helium, nitrogen, and carbon dioxide; and
   subsequently bonding the bonding side of the first substrate with the bonding side of the second substrate in one of a bonding chamber corresponding with the plasma chamber or the bonding/plasma chamber, the bonding comprising closing nano-gaps between the bonding side of the first substrate and the bonding side of the second substrate by applying a high pressing force to the first and second substrates after the bonding side of the first substrate contacts the bonding side of the second substrate, the high pressing force being in a range from 1 kN to 320 kN.

2. The method according to claim 1, wherein the modifying further comprises at least one of:
   a) altering the oxide layer on the at least one of the bonding sides of the first and second substrates; and
   b) at least partially removing part of the oxide layer from the at least one of the bonding sides of the first and second substrates.

3. The method according to claim 2, wherein said part of the oxide layer is completely removed from the at least one of the bonding sides of the first and second substrates.

4. The method according to claim 1, further comprising:
   applying an ion energy of less than 1000 eV between an upper electrode and a lower electrode of the one of the plasma chamber and the bonding/plasma chamber to expose the first and second substrate to the ion energy.

5. The method according to claim 4, wherein an AC voltage with a frequency greater than a frequency of an AC voltage applied to the lower electrode is supplied to the upper electrode.

6. The method according to claim 1, wherein a pressure applied by the high pressing force is in a range from 0.01 MPa to 10 MPa.

7. The method according to claim 1, wherein a pressure applied by the high pressing force is in a range from 0.1 MPa to 8 MPa.

8. The method according to claim 1, wherein a pressure applied by the high pressing force is in a range from 1 MPa to 5 MPa.

9. The method according to claim 1, wherein a pressure applied by the high pressing force is in a range from 1.5 MPa to 3 MPa.

10. A method for producing a direct bond between a bonding side of a first substrate and a bonding side of a second substrate in a workspace, the method comprising:
   modifying at least one of the bonding sides of the first and second substrates in one of a plasma chamber and a bonding/plasma chamber, the modifying comprising:
      changing a stoichiometry of an oxide layer on the at least one of the bonding sides of the first and second substrates;
      introducing, into the one of the plasma chamber and the bonding/plasma chamber, one or more reducing gases selected from the group consisting of hydrogen, nitrogen oxide, carbon monoxide, and methane; and
      mixing the one or more reducing gases with one or more inert gases selected from the group consisting of xenon, argon, helium, nitrogen, and carbon dioxide to form a gas mixture, the gas mixture having a concentration value between 100% of hydrogen and 0% of argon and 0% of hydrogen and 100% of argon, the gas mixture containing other gases in an amount less than or equal to 1%, the gas mixture containing less than 80% of hydrogen; and
   subsequently bonding the bonding side of the first substrate with the bonding side of the second substrate in one of a bonding chamber corresponding with the plasma chamber or the bonding/plasma chamber, the bonding comprising closing nano-gaps between the bonding side of the first substrate and the bonding side of the second substrate by applying a high pressing force to the first and second substrates after the bonding side of the first substrate contacts the bonding side of the second substrate, the high pressing force being in a range from 1 kN to 320 kN.

11. The method according to claim 10, wherein the gas mixture contains less than 60% of hydrogen.

12. The method according to claim 10, wherein the gas mixture contains less than 40% of hydrogen.

13. The method according to claim 10, wherein the gas mixture contains less than 20% of hydrogen.

14. A method for producing a direct bond between a bonding side of a first substrate and a bonding side of a second substrate in a workspace, the method comprising:
   modifying at least one of the bonding sides of the first and second substrates in one of a plasma chamber and a bonding/plasma chamber, the bonding side of the first substrate and the bonding side of the second substrate being composed of conductive regions and nonconductive regions, the modifying comprising:
      modifying an oxide layer by changing a stoichiometry of the oxide layer on the at least one of the bonding sides of the first and second substrates;
      introducing, into the one of the plasma chamber and the bonding/plasma chamber, one or more reducing gases selected from the group consisting of hydrogen, nitrogen oxide, carbon monoxide, and methane; and
      mixing the one or more reducing gases with one or more inert gases selected from the group consisting of xenon, argon, helium, nitrogen, and carbon dioxide; and
   subsequently bonding the bonding side of the first substrate with the bonding side of the second substrate in one of a bonding chamber corresponding with the plasma chamber or the bonding/plasma chamber, the subsequent bonding being enhanced by the modified oxide layer to form a hybrid bond between the conductive regions and the nonconductive regions of the first and second substrates.

15. The method according to claim 14, wherein the conductive regions are composed of metallic, and
   wherein the nonconductive regions are composed of dielectric.

16. The method according to claim 15, wherein the nonconductive regions surround the conductive regions.

17. The method according to claim 14, wherein the conductive regions are composed of copper, and
   wherein the nonconductive regions are composed of silicon oxide.

* * * * *